(12) United States Patent
Cho

(10) Patent No.: US 7,697,348 B2
(45) Date of Patent: *Apr. 13, 2010

(54) SEMICONDUCTOR MEMORY DEVICE

(75) Inventor: Ho-Youb Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/366,357

(22) Filed: Feb. 5, 2009

(65) Prior Publication Data

US 2009/0147597 A1 Jun. 11, 2009

Related U.S. Application Data

(63) Continuation of application No. 11/645,987, filed on Dec. 27, 2006, now Pat. No. 7,502,266.

(30) Foreign Application Priority Data

Aug. 31, 2006 (KR) .......................... 2006-0083737

(51) Int. Cl.
*G11C 7/10* (2006.01)
(52) U.S. Cl. ..................... 365/189.05; 365/189.02; 365/189.03; 365/189.15; 365/189.17; 365/189.08
(58) Field of Classification Search ............ 365/189.05, 365/189.01, 189.02, 189.03, 189.15, 189.17, 365/189.08
See application file for complete search history.

(56) References Cited

U.S. PATENT DOCUMENTS

| | | | |
|---|---|---|---|
| 4,071,904 A | 1/1978 | Miller ..................... 708/625 |
| 5,381,145 A * | 1/1995 | Allen et al. ................ 341/107 |
| 5,689,462 A | 11/1997 | Proebsting |
| 5,724,537 A | 3/1998 | Jones ............................ 711/1 |
| 5,787,114 A | 7/1998 | Ramamurthy et al. ....... 375/221 |
| 5,829,007 A | 10/1998 | Wise et al. ..................... 711/5 |
| 5,956,370 A | 9/1999 | Ducaroir et al. ............. 375/221 |
| 5,956,741 A | 9/1999 | Jones ............................ 711/1 |
| 6,205,223 B1 | 3/2001 | Rao et al. ...................... 380/42 |
| 6,263,422 B1 | 7/2001 | Wise et al. .................. 712/209 |
| 6,901,489 B2 | 5/2005 | Gruner et al. ............... 711/154 |
| 6,965,539 B2 * | 11/2005 | Lee ....................... 365/185.17 |
| 6,987,704 B2 | 1/2006 | Park ...................... 365/185.17 |
| 7,164,601 B2 | 1/2007 | Mitani et al. ........... 365/185.03 |
| 7,212,423 B2 | 5/2007 | Vogt ............................ 365/52 |

(Continued)

FOREIGN PATENT DOCUMENTS

JP 9-223389 8/1997

(Continued)

*Primary Examiner*—Viet Q Nguyen
(74) *Attorney, Agent, or Firm*—Blakely, Sokoloff, Taylor & Zafman

(57) ABSTRACT

A first input buffer receives sequentially inputted first data. A first data selector selectively transfers the first data from the first input buffer in accordance with a data input mode. A first data alignment circuit aligns and outputs the data from the first data selector. A second input buffer receives sequentially inputted second data in accordance with the data input mode. A second data selector selectively transfers the data of the first input buffer or of the second input buffer, in accordance with the data input mode. A first data alignment circuit aligns and outputs the data from the second data selector.

6 Claims, 6 Drawing Sheets

U.S. PATENT DOCUMENTS

| | | | |
|---|---|---|---|
| 7,349,289 B2 * | 3/2008 | Faue et al. | 365/233.13 |
| 7,502,266 B2 * | 3/2009 | Cho | 365/189.05 |
| 7,555,667 B1 * | 6/2009 | Burney et al. | 713/401 |

FOREIGN PATENT DOCUMENTS

| | | |
|---|---|---|
| KR | 2001-0065148 | 7/2001 |
| KR | 2001-0108786 | 12/2001 |
| KR | 2003-0074893 | 9/2003 |
| KR | 10-2004-0102899 | 12/2004 |

* cited by examiner

US 7,697,348 B2

SEMICONDUCTOR MEMORY DEVICE

The present patent application is a Continuation claiming the benefit of application Ser. No. 11/645,987, filed Dec. 27, 2006 now U.S. Pat. No. 7,502,266.

CROSS-REFERENCE TO RELATED APPLICATION

The present invention claims priority of Korean patent application number 10-2006-0083737, filed on Aug. 31, 2006, which is incorporated by reference in its entirety.

BACKGROUND OF THE INVENTION

The present invention relates to a semiconductor memory device; and, more particularly, to a data input circuit for use in a semiconductor memory device.

As well-known in the art, a semiconductor memory device is a semiconductor device for storing a lot of data and providing the stored data. The semiconductor memory device includes a data storage area storing data and an input/output area in which a circuit for outputting the data stored in the data storage area, or delivering inputted data thereto, is disposed. The data storage area is provided with a plurality of unit cells, each of which stores data corresponding to an address. The input/output area is provided with a data input circuit for conveying data provided from outside to the data storage area, a data output circuit for outputting data from the data storage area to the outside, a control circuit for controlling the data input circuit and the data output circuit, and an address input circuit for accepting an address from the outside and forwarding it to the data storage area.

To be more specific, the data input circuit aligns data signals provided from the outside via an input/output pad so that the data storage area can receive them, and then delivers the aligned data signals thereto. For example, in case where the data input/output circuit is operated in 4-bit prefetch, it aligns 4-bit data signals sequentially transferred through the input/output pad to 4-bit parallel data and then provides the same to the data storage area. Further, the data input circuit is connected to a data transfer line, wherein data is conveyed to the data storage area via the data transfer line.

The semiconductor memory device receives or outputs a lot of data during a single data access operation, and is provided with data input circuits corresponding to the number of data received or outputted during a single data access operation. For example, if the semiconductor memory device is designed to accept 16 data during a single data access, it is provided with 16 data input circuits. Normally, the semiconductor memory device can receive or output data of various numbers of bits such as 4, 8, and 16 bits during the single data, and is manufactured to set the number of bits by a certain control. This is because it is effective to set the number of bits, to be received and outputted, depending on the system to which the semiconductor memory device is applied (after it is manufactured).

Since the semiconductor memory device is manufactured to receive data of various numbers of bits like this, the circuit area of an area in which the data input circuit is disposed increases considerably and the circuit becomes too complicated. For example, in case of a semiconductor memory device that is operable in each of X16, X8, and X4 modes, the semiconductor memory device has to be provided with 16 data input circuits. Among these, in X16 mode, all of the 16 data input circuits are operated, in X8 mode, only 8 data input circuits are operated, and in X4 mode, only 4 data input circuits are operated.

More specifically, in X16 mode, all inputted data are conveyed to the data storage area via data transfer lines connected to the corresponding data input circuits. But, in X8 mode, data received through the 8 data input circuits cannot be conveyed directly to the data storage area via data transfer lines connected to the 8 data input circuits. That is, it is required that the inputted data be first transferred to data transfer lines corresponding to addresses of the data, and then conveyed to the data storage area. By doing so, the inputted data can be stored in a designated area. Therefore, the semiconductor memory device must be provided with the 16 data input circuits and also have a path through which the inputted data in X4 and X8 modes can be transferred to designated data transfer lines so that it can operate in all of X16, X8 and X4 modes. Thus, there is a need for lots of lines to embody the path capable of transferring data between the 16 data input circuits. Moreover, because of the above need, an area in which the data input circuits are arranged becomes very complicated.

FIG. 1 is a block diagram of a conventional data input circuit used in a semiconductor memory device. In particular, FIG. 1 shows one example of the semiconductor memory device which is provided with 16 data input circuits, and thus performs 4-bit prefetch operation and operates in X4, X8 and X16 modes, respectively.

Referring to FIG. 1, the semiconductor memory device is provided with 16 data input circuits 10_1 to 10_16. Each of the data input circuits 10_1 to 10_16 receives a corresponding one of data signals DQ<0> to DQ<15>, aligns it to 4-bit parallel data, and provides the same to a data storage area. For example, the data input circuit 10_1 outputs sequentially inputted 4-bit data signals DQ<0> as 4-bit parallel data (see a region A represented by a doted line).

These data input circuits can be classified into 4 types. This is to receive and process data according to each of data input modes, X4, X8 and X16.

The first type of data input circuits are the data input circuits 10_1 to 10_4 that take data signals in X4, X8, and X16 modes. Among these circuits, one data input circuit, for instance, the data input circuit 10_1, is provided with an input latch circuit 11_1, a MUX 12_1 and a global driver 13_1. The input latch circuit 11_1 takes sequentially inputted 4-bit data signals, aligns them to aligned data signals ALG0, and outputs the same. The MUX 12_1 selectively outputs the 4-bit data signals latched by the input latch circuit 11_1 in response to the input mode of X4, X8, or X16. The global driver 13_1 drives four global lines GIO<0> by using the 4-bit data signals from the MUX 12_1. This data input circuit 10_1 receives the data signals in X4, X8, and X16 modes, respectively. A switch S1 provided in the MUX 12_1 is operated in all of X4, X8, and X16 modes, and is selectively turned on in response to an address corresponding to the inputted data. Even though there is illustrated only one switch in the MUX 12_1, 4 switches are necessary to process 4-bit data in parallel.

The second type of data input circuits are the data input circuits 10_5 to 10_8 that receives data signals in X8 and X16 modes. For instance, the data input circuit 10_5 is provided with an input latch circuit 11_5, a MUX 12_5 and a global driver 13_5. The MUX 12_5 is composed of two switches S2 and S3. The switch S2 is selectively turned on in response to an address corresponding to the data inputted to the data input circuit 10_1 in X4 mode, and the switch S3 is selectively turned on in response to an address corresponding to the data inputted to the data input circuit 10_5 in X8 and X16 modes. Even though there are illustrated only two switches in the MUX 12_5, 4 switches are necessary to process 4-bit data in parallel.

The third type of data input circuits are the data input circuits 10_9 to 10_16 that accept data signals in X16 mode. For instance, the data input circuit 10_9 is provided with an input latch circuit 11_9, a MUX 12_9 and a global driver 13_9. The MUX 12_9 is composed of three switches S4, S5 and S6. The switch S4 is selectively turned on in response to an address corresponding to the data inputted to the data input circuit 10_1 in X4 mode. The switch S5 is selectively turned on in response to an address corresponding to the data inputted to the data input circuit 10_1 in X8 mode. And, the switch S6 is selectively turned on in response to an address corresponding to the data inputted to the data input circuit 10_9 in X16 mode. Even though there are illustrated only three switches in the MUX 12_9, 4 switches are necessary to process 4-bit data in parallel.

FIG. 2 shows a detailed block diagram of one of the input latch circuits depicted in FIG. 1, for example, 11_1.

Referring to FIG. 2, the input latch circuit 11_1 is provided with an input buffer 11A, a delay circuit 11B, and a plurality of latch circuits 11C to 11I. The input buffer 11A buffers the data signal received via the data input/output pad, and the delay circuit 11B delays an output of the input buffer 11A. The plurality of latch circuits 11C to 11I latch the data signal in response to rising and falling data strobe signals DQSR and SQSF. The data latched by the latches 11D, 11E, 11H, and 11I are fed to respective next blocks as 4-bit aligned internal data.

In X16 mode, all of the 16 data input circuits 10_1 to 10_16 shown in FIG. 1 receive the data signals. Each of the 16 data input circuits 10_1 to 10_16 aligns each received data signal and outputs it to a global line connected thereto. In X8 mode, the data input circuits 10_1 to 10_8 receive the data signals. The data signals received through the data input circuits 10_1 to 10_8 may be outputted via global lines connected to the circuits 10_1 to 10_8, or via global lines connected to the rest data input circuits 10_9 to 10_16 that do not receive the data signals. This is decided based on an address corresponding to the data signal inputted in X8 mode. Since all the unit cells involved in the data storage area correspond to the 16 global lines connected to the 16 data input circuits, the data signal inputted in X8 must be transferred to the global line connected to the corresponding unit cell depending on the address.

In X4 mode, the data input circuits 10_1 to 10_4 receive the data signals. The data signals received through the data input circuits 10_1 to 10_4 may be outputted via global lines connected thereto, or via global lines connected to the data input circuits 10_5 to 10_16 that do not receive the data signals. To be more specific, the data inputted through the data input circuit 10_1 may be outputted via global line connected to the circuit 10_1, or via global line connected to any one selected from the data input circuits 10_5, 10_9 and 10_13. This selection of the data input circuit is decided based on an address corresponding to the data signal received through the data input circuit 10_1.

As mentioned above, various lines between the data input circuits are required to operate according to all of X16, X8 and X4 modes, and a plurality of switches have to be arranged in MUXs 12_1, 12_5, . . . , and so on. For example, in case of prefetching 4-bit data, 48 lines (4*12) are necessary to selectively provide the data inputted in X4 mode to the 16 data input circuits.

In order to support the number of data that can be received by the semiconductor memory device diversely as discussed above, too many lines and switches are disposed in an area in which the data input circuits are arranged, thereby increasing the circuit area of the semiconductor memory device.

SUMMARY OF THE INVENTION

It is, therefore, an object of the present invention to provide a semiconductor memory device having a data input circuit which is implemented in more efficient manner to receive data of various numbers of bits during a single data access operation.

In accordance with one aspect of the present invention, there is provided a semiconductor memory device, including: a first input buffer receiving a plurality of sequentially inputted first data; a first data selector for selectively transferring the plurality of first data from the first input buffer in accordance with a data input mode; a first data alignment circuit for aligning and outputting the plurality of data from the first data selector; a second input buffer receiving a plurality of sequentially inputted second data in accordance with the data input mode; a second data selector for selectively transferring the plurality of data of the first input buffer or of the second input buffer in accordance with the data input mode; and a first data alignment circuit for aligning and outputting the plurality of data from the second data selector.

In accordance with another aspect of the present invention, there is provided a semiconductor memory device, including: a first input buffer receiving a plurality of sequentially inputted first data; a first data selector for selectively transferring the plurality of first data from the first input buffer in accordance with first to third data input modes; a first data alignment circuit for aligning and outputting the plurality of data from the data selector; a second input buffer receiving a plurality of sequentially inputted second data in accordance with the data input mode; a second data selector for selectively transferring the plurality of data of the first input buffer or of the second input buffer in accordance with the second and the third data input modes; a first data alignment circuit for aligning and outputting the plurality of data from the second data selector; a third input buffer receiving sequentially inputted third data in accordance with the third input mode; a third data selector for selectively transferring outputs of the first to third input buffers in accordance with the third input mode; a third data alignment circuit for aligning and outputting the data from the third data selector; a fourth input buffer receiving sequentially inputted fourth data in accordance with the third data input mode; a fourth data selector for selectively transferring outputs of the first to third input buffers in accordance with the third data input mode; and a fourth data alignment circuit for aligning and outputting data from the fourth data selector.

In accordance with still another aspect of the present invention, there is provided a semiconductor memory device, including: a first input buffer for receiving and transferring sequentially inputted first data; a second input buffer for receiving and transferring sequentially inputted second data; a first switching circuit for transferring the first data in response to an address of the first data in a first and a second data input modes; a second switching circuit for transferring the first data in response to the address of the first data in the first data input mode; a third switching circuit for transferring the second data in the second data input mode; a first data alignment circuit for aligning and outputting the plurality of first data from the first switching circuit; and a second data alignment circuit for aligning and outputting the plurality of first data from the second switching circuit or the plurality of second data from the third switching circuit.

In accordance with still yet another aspect of the present invention, there is provided a semiconductor memory device, including: a first to fourth input buffers for receiving and transferring a plurality of sequentially inputted first to fourth data, respectively; a first switching circuit for transferring the first data in response to an address of the first data in a first to third data input modes; a second switching circuit for transferring the first data in response to the address of the first data in the first data input mode; a third switching circuit for transferring the second data in the second and third data input modes; a fourth switching circuit for transferring the first data in response to the address of the first data in the first data input mode; a fifth switching circuit for transferring the second data in response to the address of the second data in the second data input mode; a sixth switching circuit for transferring the third data in the third data input mode; a first alignment circuit for aligning the plurality of first data from the first switching circuit; and a second alignment circuit for aligning the plurality of first data from the second switching circuit or the plurality of second data from the third switching circuit; and a third alignment circuit for aligning the plurality of first data from the fourth switching circuit, the plurality of second data from the fifth switching circuit, or the plurality of third data from the sixth switching circuit.

In accordance with a further another aspect of the present invention, there is provided a method for driving a semiconductor memory device receiving data of numbers of bits corresponding to data input modes, including the steps of: receiving a plurality of sequentially inputted data; transferring the plurality of data to corresponding lines; aligning the plurality of data on the lines; and conveying the plurality of aligned data to a data storage area.

The other objectives and advantages of the invention will be understood by the following description and will also be appreciated by the embodiments of the invention more clearly. Further, the objectives and advantages of the invention will readily be seen that they can be realized by the means and its combination specified in the claims.

DESCRIPTION OF SPECIFIC EMBODIMENTS

Hereinafter, preferred embodiments of the present invention will be set forth in detail with reference to the accompanying drawings to the extent that a person skilled in the art can easily carry out the invention.

Figure 1:
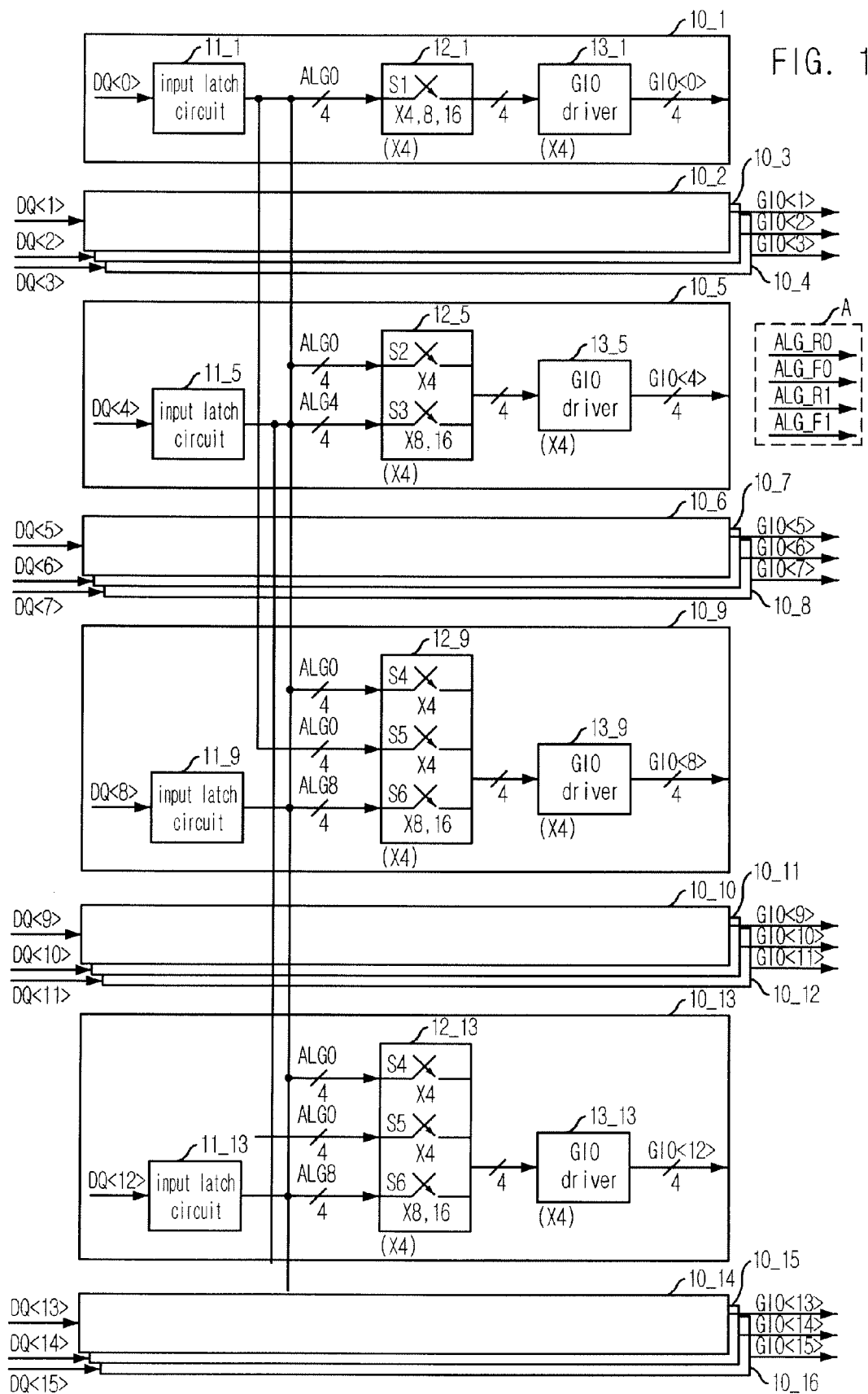
FIG. 1 is a block diagram of a conventional data input circuit for use in a semiconductor memory device.
Figure 2:
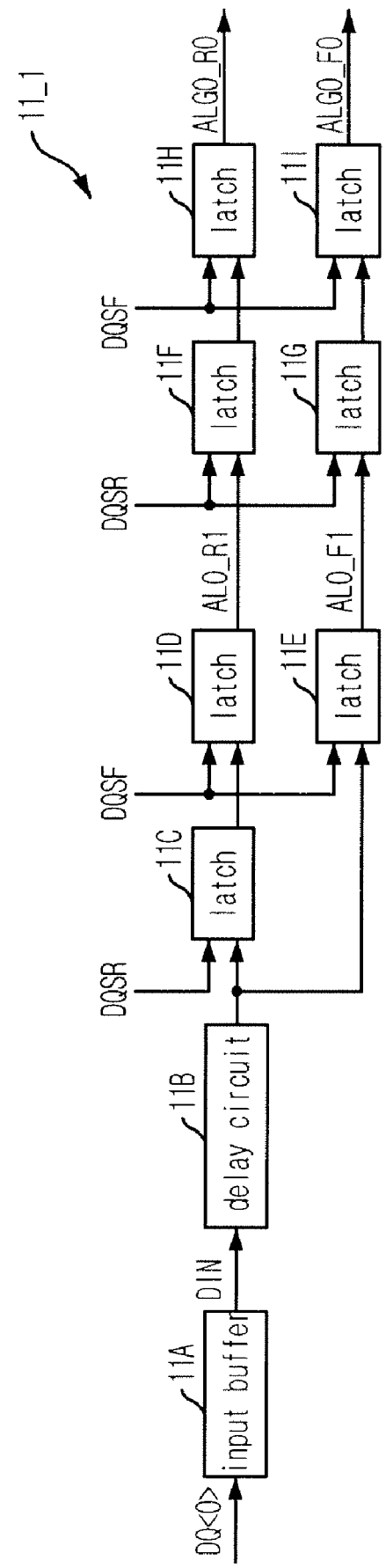
FIG. 2 shows a detailed block diagram of the input latch circuit depicted in FIG. 1.
Figure 3:
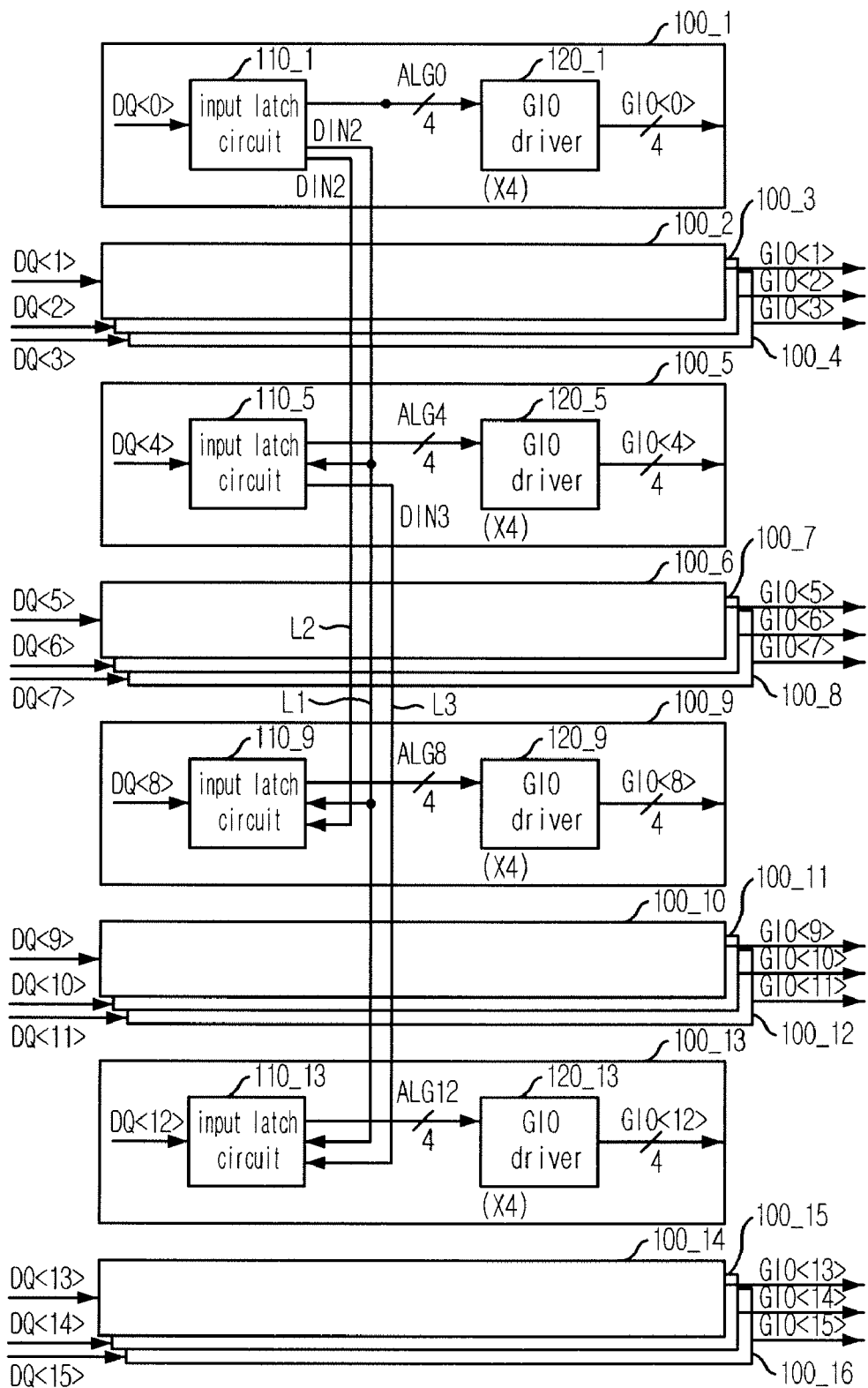
FIG. 3 illustrates a block diagram of a data input circuit for use in a semiconductor memory device in accordance with a preferred embodiment of the present invention.

FIG. 3 shows a block diagram of a semiconductor memory device in accordance with a preferred embodiment of the present invention. Especially, FIG. 3 illustrates a block diagram of a data input circuit for use in the semiconductor memory device.

Referring to FIG. 3, the semiconductor memory device of this embodiment includes a plurality of data input circuits 100_1 to 100_16. Each of the data input circuits 100_1 to 100_16 is provided with a data latch circuit for receiving and aligning data, and a GIO driver for driving a global line by using the aligned data outputted from the data latch circuit. For instance, the data input circuit 100_1 is provided with a data latch circuit 110_1 and a GIO driver 120_1. A global line GIO<0> connected to the global driver is to convey data to a plurality of unit cells arranged in the data storage area.

The semiconductor memory device according to this embodiment receives data in one of X4, X8, and X16 modes. In X4 mode, the semiconductor memory device receives 4-bit data through each of the data input circuits 100_1 to 100_4. In X8 mode, the semiconductor memory device accepts 4-bit data through each of the data input circuits 100_1 to 100_8. And, in X8 mode, the semiconductor memory device takes 4-bit data through each of the data input circuits 100_1 to 100_16. Here, the reason that one data input circuit sequentially-receives the 4-bit data is that the number of data to be prefetched is 4 bits.

On the other hand, the plurality of unit cells prepared in the data storage area of the semiconductor memory device is mapped onto the global lines GIO<0> to GIO<15>. Thus, the data received through the 4 data input circuits 110_1 to 110_4 in X4 mode should be transferred to the global lines selected by the corresponding addresses.

In X4 mode, the data are received through the 4 data input circuits 100_1 to 100_4. At this time, in order to enable the inputted data to be stored in a place indicating a corresponding address, the inputted data should first be transferred to corresponding global lines. For this, the semiconductor memory device is provided with a line or wiring L1. That is, the line L1 is for conveying the inputted data to the corresponding global line. For example, in X4 mode, the received data through the input latch circuit 110_1 of the data input circuits 100_1 to 100_4 can be conveyed to the GIO driver 120_1 by a corresponding address. After conveying the data to one of the input latches 110_5, 110_9 and 10_13 via the line L1, they may be transferred to the GIO drivers 120_5, 120_9 and 120_13 corresponding to the input latch circuits 110_5, 110_9 and 110_13, respectively. Although they are not all shown, 3 lines such as the line L1 are further arranged as a result. The 3 lines are to convey the data that are inputted to the input latch circuits of the data input circuits 100_1 to 100_3 and then aligned to the input latch circuits of the data input circuits which do not receive the data, respectively.

In succession, in X8 mode, the data are received through the 8 data input circuits 100_1 to 100_8. At this time, the inputted data may be transferred to the data storage area through each of the GIO drivers 120_1 to 120_8 and the global lines GIO<0> to GIO<8> provided in the data input circuits 100_1 to 100_8, or through the GIO drivers 120_9 to 120_16 and the global lines GIO<8> to GIO<16> provided in the data input circuits 100_9 to 100_16 that do not receive the inputted data. This transfer of the data to the data storage region, through particular data input circuits, is decided based on an address corresponding to the inputted data. At this time, lines L2 and L3 are provided to convey the data between the data input circuits. The line L2 is to convey the data aligned by the input latch circuit 110_1 of the data input circuit 100_1 to the input latch circuit 110_9 of the data input circuit 100_9. The line L3 is for conveying the data aligned by the input latch circuit 110_5 of the data input circuit 100_5 to the input latch circuit 110_13 of the data input circuit 100_13.

Figure 4:
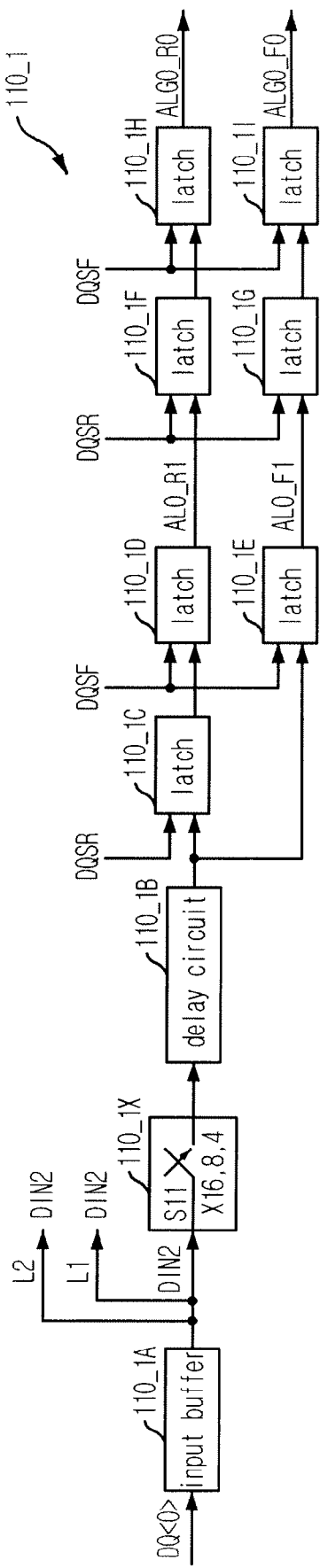
FIGS. 4 to 6 show a detailed block diagram of each of the input latch circuits depicted in FIG. 3.

FIG. 4 shows a detailed block diagram of the input latch circuit 110_1 depicted in FIG. 3.

Referring to FIG. 4, the input latch circuit 110_1 is provided with an input buffer 110_1A, a data selector 110_1X, a delay circuit 110_1B, and latch circuits 110_1C to 110_1I. The input buffer 110_1A receives and buffers data from outside, and outputs it to a next stage, and the data selector 110_1X is composed of a switch S11. The switch S11 selectively transfers the data signal provided from the input buffer 110_1A to the delay circuit 110_1B in X16, X8, and X4 modes. The delay circuit 110_1B delays the data signal from the data selector 110_1X by a predetermined time, and then outputs the delayed signal. The predetermined time refers to a time required for the semiconductor memory device to generate internal data strobe signals DQSR and DQSF that are reference signals for receiving a data strobe signal and aligning the data by the latch circuits 110_1C to 110_1I. The latch circuits 110_1C to 110_1I align the 4-bit data sequentially outputted through the delay circuit 110_1B to parallel data ALG0_R0, ALG0_F0, ALG0_R1, and ALG0_F1 in response to the internal data strobe signals DQSR and DQSF, and then output the aligned data.

Figure 5:
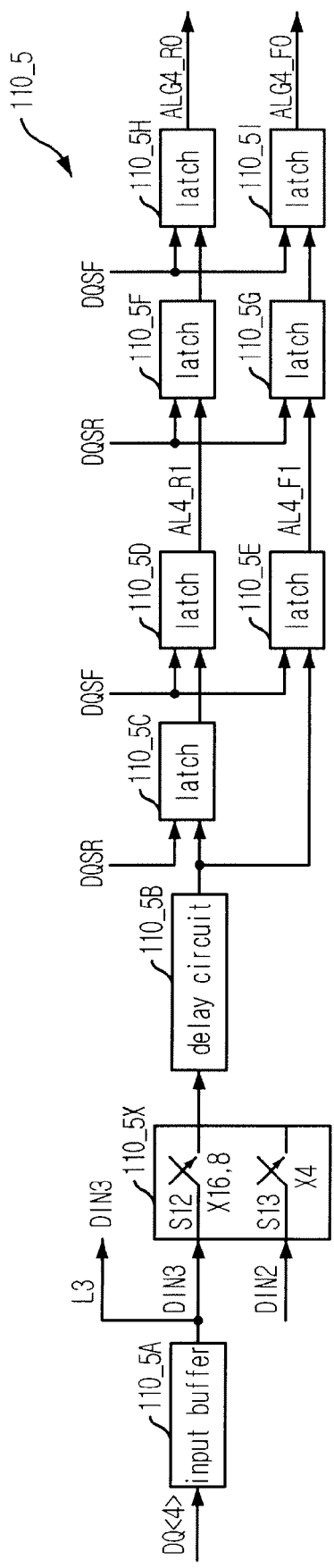

FIG. 5 offers a detailed block diagram of the input latch circuit 110_5 depicted in FIG. 3.

Referring to FIG. 5, the input latch circuit 110_5 is provided with an input buffer 110_5A, a data selector 110_5X, a delay circuit 100_5B, and latch circuits 110_5C to 110_5I. The input buffer 110_5A receives and buffers data from outside, and outputs it to a next stage, and the data selector 110_5X is composed of switches S12 and S13. The switch S12 selectively transfers the data signal from the input buffer 110_5A to the delay circuit 110_5B in X16 and X8 modes. The switch S13 selectively transfers the data signal DIN2 provided from the input buffer 110_1A via the line L1 (see FIG. 4) to the delay circuit 110_1B in X4 mode. The data signal DIN3 outputted through the line L3 is provided to the input latch circuit 110_13 of the data input circuit 100_13 shown in FIG. 3. The delay circuit 1105B delays the data signal from the data selector 110_5X by a predetermined time, and then outputs the delayed signal. The predetermined time refers to a time required for the semiconductor memory device to generate internal data strobe signals DQSR and DQSF that are reference signals for receiving a data strobe signal and aligning the data by the latch circuits 110_5C to 110_5I. The latch circuits 110_5C to 110_5I prepared in the data input circuit align the 4-bit data sequentially outputted through the delay circuit 110_1B to parallel data ALG5_R0, ALG5_F0, ALG5_R1, and ALG5_F1 in response to the internal data strobe signals DQSR and DQSF, and then output the aligned data.

Figure 6:
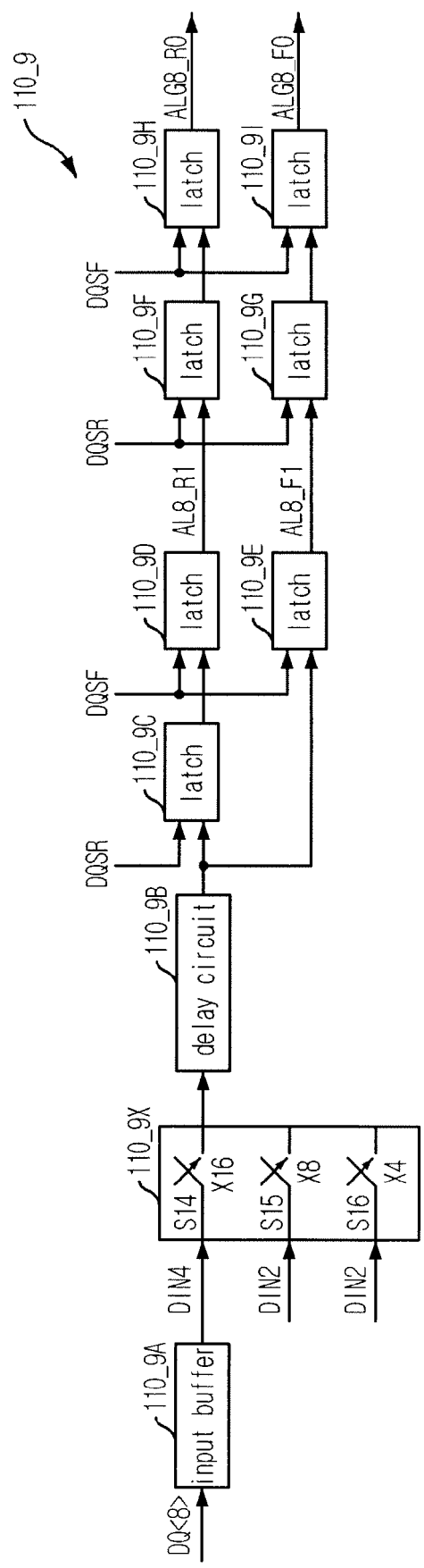

FIG. 6 shows a detailed block diagram of the input latch circuit 110_9 depicted in FIG. 3.

Referring to FIG. 6, the input latch circuit 110_9 is provided with an input buffer 110_9A, a data selector 110_9X, a delay circuit 100_9B, and latch circuits 110_9C to 110_9I. The input buffer 110_9A receives and buffers data from outside, and outputs it to a next stage, and the data selector 110_9X is composed of switches S14, S15 and S16. The switch S14 selectively transfers the data signal from the input buffer 110_9A to the delay circuit 110_9B in X16 mode. The switch S15 selectively transfers the data signal DIN2 provided from the input buffer 110_1A via the line L1 (see FIG. 4) to the delay circuit 110_9B in X8 mode. The switch S16 selectively transfers the data signal DIN2 provided from the input buffer 110_1A via the line L2 to the delay circuit 110_9B in X4 mode. The delay circuit 110_9B delays the data signal from the data selector 110_9X by a predetermined time, and then outputs the delayed signal. The predetermined time refers to a time required for the semiconductor memory device to generate internal data strobe signals DQSR and DQSF that are reference signals for receiving a data strobe signal and aligning the data by the latch circuits 110_9C to 110_9I. The latch circuits 110_9C to 110_9I prepared in the data input circuit align the 4-bit data sequentially outputted through the delay circuit 110_1B to parallel data ALG5_R0, ALG5_F0, ALG5_R1, and ALG5_F1 in response to the internal data strobe signals DQSR and DQSF, and then output the aligned data.

In X16 mode, all of the data input buffers 110_1A to 110_16A provided in the 16 data input circuits 100_1 to 100_16 receive the data signals and then deliver them to the corresponding delay circuits 110_1B to 110_16B. The switches S11, S12 and S16 selectively provide the data signals from the corresponding input buffers to the corresponding delay circuits. Further, although not all shown, data input buffers 110_2A to 101_4A are connected to correspond to the switch S11. The data transferred to each delay circuit are delayed by the predetermined time, and then transferred to the plurality of latch circuits prepared at the next stage for aligning to parallel data.

In X8 mode, all of the data input buffers 110_1A to 110_8A provided in the 8 data input circuits 100_1 to 100_8 receive the data signals. At this time, the received data signals may be transferred to the delay circuits 110_1B to 110_8B corresponding to the data input buffers 110_1A to 110_8A, or to the delay circuits 110_9B to 110_16B corresponding to the data input buffers 110_9A to 110_16A. For example, the data signal DIN3 from the input buffer 110_5A may be transferred to the delay circuit 110_5B through the switch S12, or to the delay circuit of the data input circuit 100_13 via the line L3 and a switch in provided in a data selector (not shown) of the input latch circuit 110_13. This is decided by an address corresponding to the data signal inputted to the data input circuit 110_5. The data transferred to each delay circuit is delayed by a predetermined time and then transferred to the plurality of latch circuits provided at the next stage for aligning to parallel data.

In X4 mode, all of the data input buffers 110_1A to 110_4A provided in the 4 data input circuits 100-1 to 100_4 receive the data signals. At this time, the received data signals may be transferred to the delay circuits 110_1B to 110_4B corresponding to the data input buffers 110_1A to 110_4A, or to the delay circuits 110_5B to 110_8B corresponding to the data input buffers 110_5A to 110_8A, or to the delay circuits 110_9B to 110_12B corresponding to the data input buffers 110_9A to 110_12A, or to the delay circuits 110_13B to 110_16B corresponding to the data input buffers 110_13A to 110_16A. For example, the data signal DIN2 transferred from the input buffer 110_1A may be transferred to the delay circuit 110_1B through the switch S11, or to the delay circuit 110_5B of the data input circuit 100_13 via the line L1 and the switch S13 provided in the data selector 110_5X of the input latch circuit 110_5, or to the delay circuit 110_9B via the line L1 and the switch S16 provided in the data selector 110_9X, or to a delay circuit (not shown) via the line L1 and a switch (not shown) of the data selector 110_13X. This transfer of the data inputted to the input buffer 110_1A to which delay circuits in X4 mode is decided based on an address corresponding to the inputted data. The data transferred to each delay circuit is delayed by a predetermined time and then transferred to the plurality of latch circuits prepared at the next stage for aligning to parallel data.

As described above, in the semiconductor memory device according to this embodiment, in case where a part of the data input circuits operates depending on the input data mode, data is first transferred to the data input circuit having the global line corresponding to a place where the data is to be stored, and then aligned. In this way, the lines of the data input circuits of the semiconductor memory device receiving various data can be remarkably reduced. In the prior art, it was required that the semiconductor memory device that supports the operation of X4, X8 and X16 modes and performs 4-bit prefetch operation needs 48 lines to transfer all of inputted data to the corresponding global lines. That is, in X4 mode, 16 lines were needed to transfer the 4-bit data inputted to the 4 data input circuits to the rest 12 data input circuits, respectively. In X8 mode, 32 lines were needed to transfer the 4-bit data inputted to the 8 data input circuits to the rest 8 data input circuits, respectively. If the semiconductor memory device supports from X4 mode to X32 mode, too many lines would be needed in the data input circuits.

On the contrary, the present invention additionally needs only 12 lines in order to support all of X4, X8 and X16 modes. Namely, the data input circuits additionally need 4 lines to support X4 mode, and 8 lines to support X8 mode.

Figure 7:
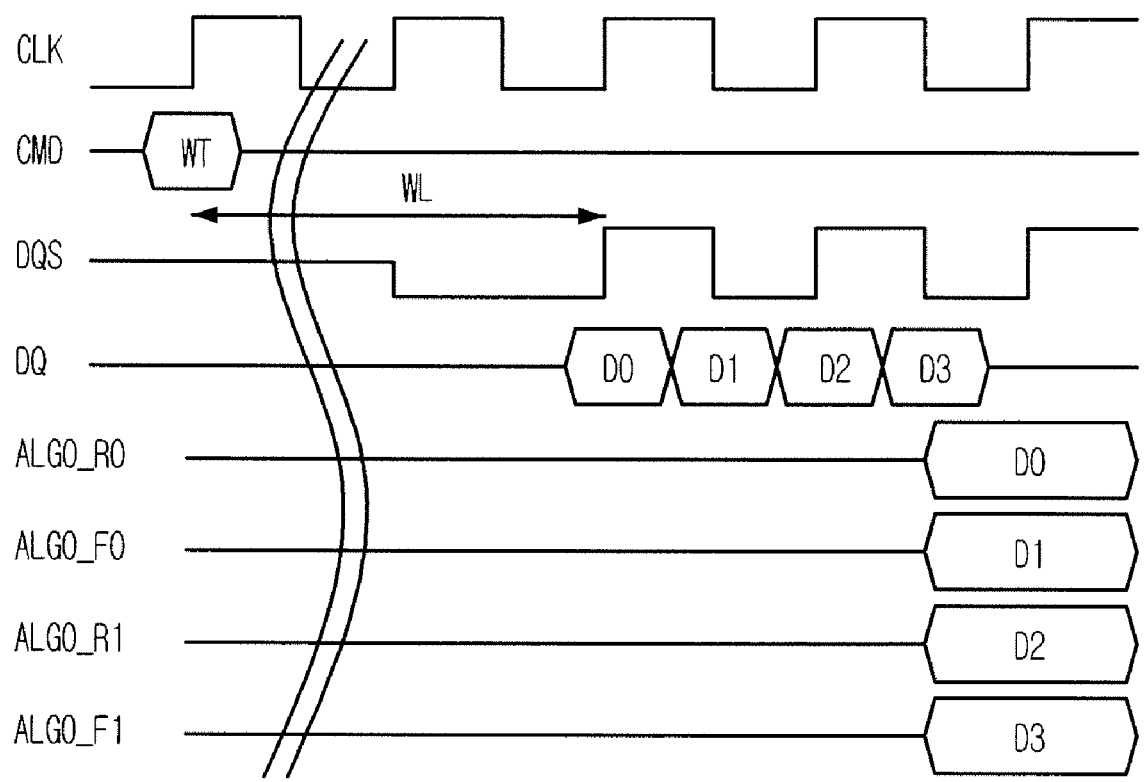
FIG. 7 shows a waveform diagram describing the operation of the semiconductor memory device depicted in FIG. 3.

FIG. 7 shows a waveform diagram describing the operation of the semiconductor memory device depicted in FIG. 3. That is, FIG. 7 represents a waveform diagram where sequentially inputted 4-bit data D0 to D3 by a write command WT are aligned to 4-bit parallel data ALG_R0, ALG_F0, ALG_R1, and ALG_F1.

Even though the semiconductor memory device of the present invention is illustrated to support only 3 data input modes, the present invention can be applied to other semiconductor memory devices having various data input modes where necessary. Further, the embodiment of the present invention has been described with respect to the case of prefetching 4-bit data, but it should be noted that the present invention can be applied to other semiconductor memory devices that receive and prefetch data of various number of bits where necessary.

As described above, the present invention can greatly reduce lines of the data input circuits which receive and process data of various numbers of bits according to a data input mode, in the semiconductor memory device performing the prefetch operation. Moreover, the present invention can decrease a layout area of circuit by reducing the number of lines receiving the data and thus arrange the data input circuits more efficiently.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   input buffers configured to buffer a plurality of sequentially inputted data in accordance with a data input mode;
   data alignment circuits configured to align the plurality of sequentially inputted data buffered from the input buffers, respectively, to output parallel data; and
   a data selector configured to selectively transfer the plurality of sequentially inputted data from the input buffers to the data alignment circuits in accordance with the data input mode.

2. The semiconductor memory device as recited in claim 1, wherein the input buffers include:
   a first input buffer configured to buffer a plurality of sequentially inputted first data to output buffered first data; and
   a second input buffer configured to buffer a plurality of sequentially inputted second data in accordance with the data input mode to output buffered second data.

3. The semiconductor memory device as recited in claim 2, wherein the data alignments circuits include:
   a first data alignment circuit configured to align the buffered first data; and
   a second data alignment circuit configured to align the buffered first data or the buffered second data in accordance with the data input mode.

4. The semiconductor memory device as recited in claim 3, wherein the data selector selectively transfers the buffered first data to the first data alignment circuit in accordance with the data input mode, and selectively transfers the buffered first data or the buffered second data to the second data alignment circuit in accordance with the data input mode.

5. The semiconductor memory device as recited in claim 2, wherein, in the data input mode that only the plurality of sequentially inputted first data are inputted, the data selector transfers the buffered first data in response to an address of the plurality of sequentially inputted first data.

6. The semiconductor memory device as recited in claim 3, further comprising:
   a first global line;
   a first global driver configured to drive the first global line by using an output of the first data alignment circuit;
   a second global line; and
   a second global driver configured to drive the second global line by using an output of the second data alignment circuit.

* * * * *